(12) United States Patent
Chen (10) Patent No.: US 8,044,375 B2
(45) Date of Patent: Oct. 25, 2011

(54) APPARATUS AND METHOD FOR ION BEAM IMPLANTATION USING SCANNING AND SPOT BEAMS

(75) Inventor: Jiong Chen, San Jose, CA (US)

(73) Assignee: Kingstone Semiconductor Company, Limited (CN)

( * ) Notice: Subject to any disclaimer, the term of this patent is extended or adjusted under 35 U.S.C. 154(b) by 23 days.

(21) Appl. No.: 12/661,480

(22) Filed: Mar. 18, 2010

(65) Prior Publication Data

US 2010/0237231 A1    Sep. 23, 2010

Related U.S. Application Data

(60) Provisional application No. 61/210,478, filed on Mar. 18, 2009.

(51) Int. Cl.
 *H01J 37/317* (2006.01)
(52) U.S. Cl. .................................. 250/492.21
(58) Field of Classification Search ............. 250/492.21, 250/396 R
See application file for complete search history.

(56) References Cited

U.S. PATENT DOCUMENTS 6,918,351 B2 *   7/2005   Chen et al. .............. 118/723 CB
7,851,773 B2 *  12/2010   Glavish et al. ........... 250/492.21

* cited by examiner

*Primary Examiner* — Kiet Nguyen
(74) *Attorney, Agent, or Firm* — Bo-In Lin (57) ABSTRACT

An ion implantation apparatus with multiple operating modes is disclosed. The ion implantation apparatus has an ion source and an ion extraction means for forming a converging beam on AMU-non-dispersive plane therefrom. The ion implantation apparatus includes magnetic scanner prior to a magnetic analyzer for scanning the beam on the non-dispersive plane, the magnetic analyzer for selecting ions with specific mass-to-charge ratio to pass through a mass slit to project onto a substrate. A rectangular quadruple magnet is provided to collimate the scanned ion beam and fine corrections of the beam incident angles onto a target. A deceleration or acceleration system incorporating energy filtering is at downstream of the beam collimator. A two-dimensional mechanical scanning system for scanning the target is disclosed, in which a beam diagnostic means is build in.

4 Claims, 11 Drawing Sheets

Front view

Figure 7A

Side view

Rectangular quadruple magnet

Bar magnet collimate divergent beam (Top View)

Figure 8B

Figure 8C  Bar magnet's magnetic field

APPARATUS AND METHOD FOR ION BEAM IMPLANTATION USING SCANNING AND SPOT BEAMS

The Non-Provisional Application claims a Priority Date of Mar. 18, 2009 benefited from a Provisional Application 61/210,479 filed by a same Applicant of this Non-Provisional Application. The disclosures made in Provisional Application 61/210,479 are hereby incorporated by reference in this Non-Provisional Application.

FIELD OF THE INVENTION

The invention disclosed herein relates generally to ion implantation. Specifically, this invention relates to improvements of ion implantation controls in ion beam incident angles, dose accuracy, implantation apparatus productivities at a wide range of ion energies (few hundreds of eV to several tens of keV).

BACKGROUND OF THE INVENTION

Ion implantation is used to introduce atoms or molecules, generally referred to as dopants into a target substrate to change the material properties of the substrate. The technologies of Ion implantation are gaining particular interest because the ion implantation process is a process commonly used in making modern integrated circuits. Furthermore, ion implantation may also be used for thin film deposition with controlled thickness and predefined surface properties for manufacturing optical or display devices such as flat panel displays.

In certain applications it is advantageous to generate ion beams in the form of ribbon-shaped beams having high aspect ratios, particularly in the implantation of 300 or 450 mm wafers to generate a beam with the cross-section that is much larger in one dimension than the other. These ribbon beams are commonly used in ion implanter apparatus and implantation systems where a single workpiece such as a silicon wafer or flat panel display is moved in a single dimension through the ion beam. However, in order to reach a uniform dose of ions over the substrate the intensity of ribbon beam must be tuned to have a uniform intensity across the ribbon direction. The beam intensity uniformity is commonly obtained by moving some beamlets from higher intensity regions to regions that have lower intensity. For these reasons, the beam angle uniformity is sacrificed, which could be detrimental when applied in the fabrication processes of particular advanced integrated circuits. Specifically, when non-uniform beam incident angles relative to the wafers can generate large shadowing effect variations as the device dimension shrinks. The shadowing effects can cause non-uniform and insufficient dopants concentrations in some area on a wafer. Therefore, the non-uniform beam incident angles produce different shadowing effects thus cause the poor dopant uniformity on the wafer that leads to reduced production yields due to the ion implant deviations. For these reasons, there is an urgent need to improve the implant angle uniformity. These problems and difficulties are further explained below in FIGS. 1 to 3.

Figure 1:
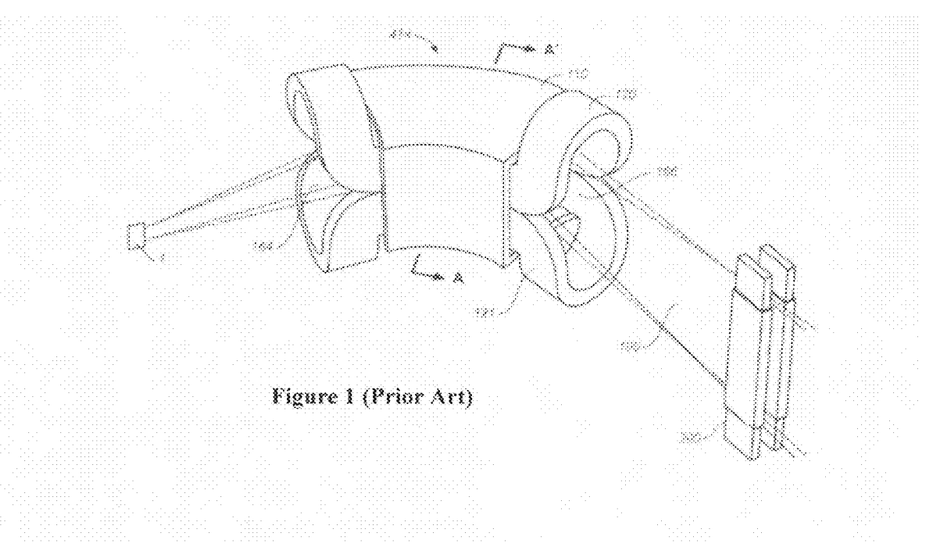
FIG. 1 is a perspective view of a ribbon-beam system according to the prior arts in which the ion beam diverges through an analyzer magnet and is then collimated by a lens.

FIG. 1 is a perspective view of a ribbon-beam system according to the prior arts in which the ion beam diverges through an analyzer magnet and is then collimated by a lens. The beam is expanded through the AMU magnet to form a ribbon shape beam. The collimator corrected the beam divergent angles. However, this system needs a device to manipulate beam intensity so that beam can be uniformed. It is not an easy task to develop a device and beam intensity control algorithm to provide a uniform beam. The most problematic issue is that the beam angle uniformity has to be sacrificed for beam intensity uniformity since beamlets are moved from higher intensity regions to lower regions. These beamlet moves are accomplished by changing beamlet angles.

Figure 2:
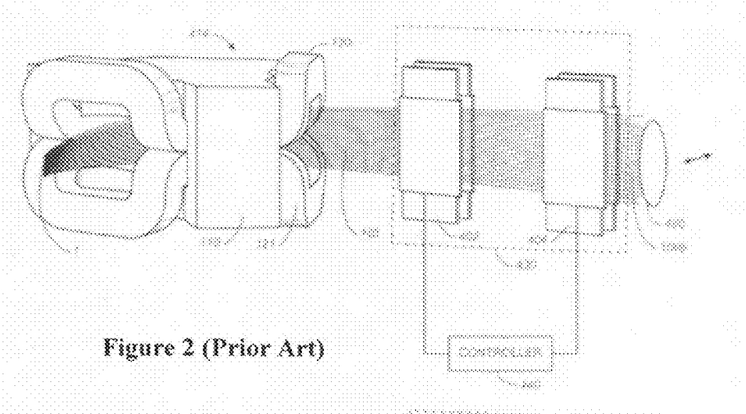
FIG. 2 is a perspective view of another conventional implant system that generates a narrow beam taller than the target.
Figure 2A:
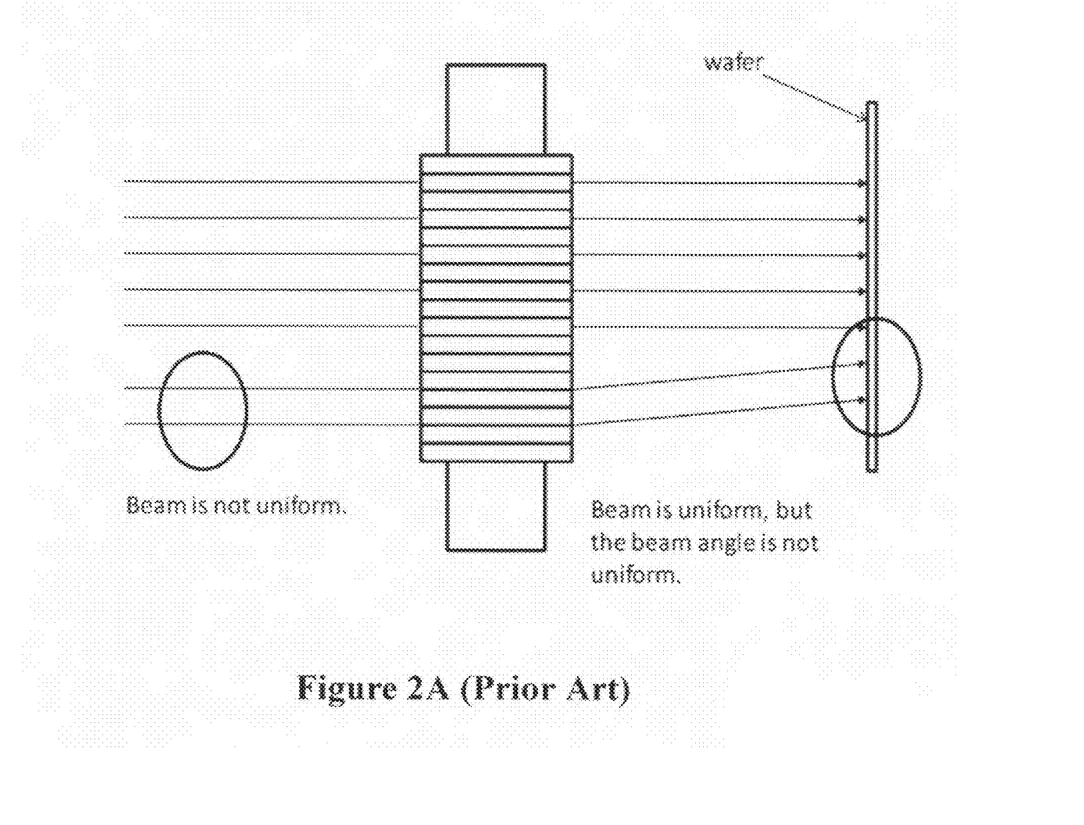
FIG. 2A is a cross sectional view to show different parts of the beam is moved to have different incident angle towards wafers.

FIG. 2 depicts another conventional ion implantation system that generates a narrow beam taller than the target. The beam current is tuned to uniformity by a multipole magnet 402 and multipole magnet 404. The multipoles move some parts of the beam from a position (high intensity) to another position (low intensity) in divergent direction, i.e., a vertical direction as shown in the figure. But the movement of the beam causes the non-uniformity in the implant angles. Different parts of the beam will have different incident angle towards wafers as shown in FIG. 2A.

Figure 3:
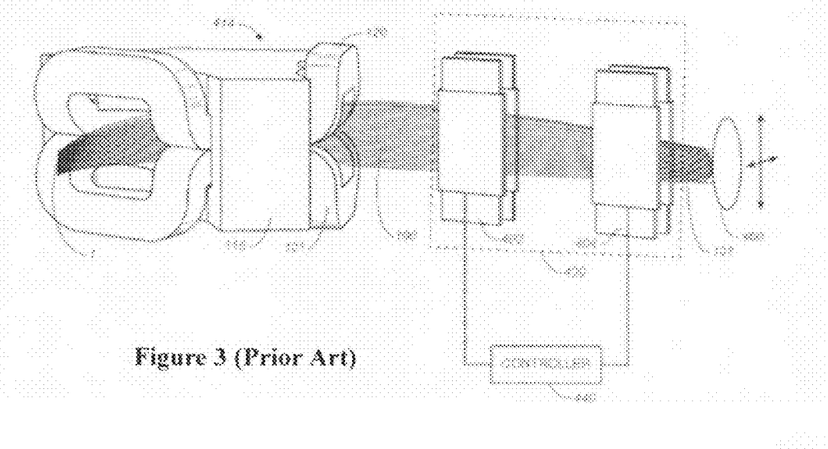
FIG. 3 is a perspective of another conventional implant system that generates a spot beam smaller than the target.
Figure 3A:
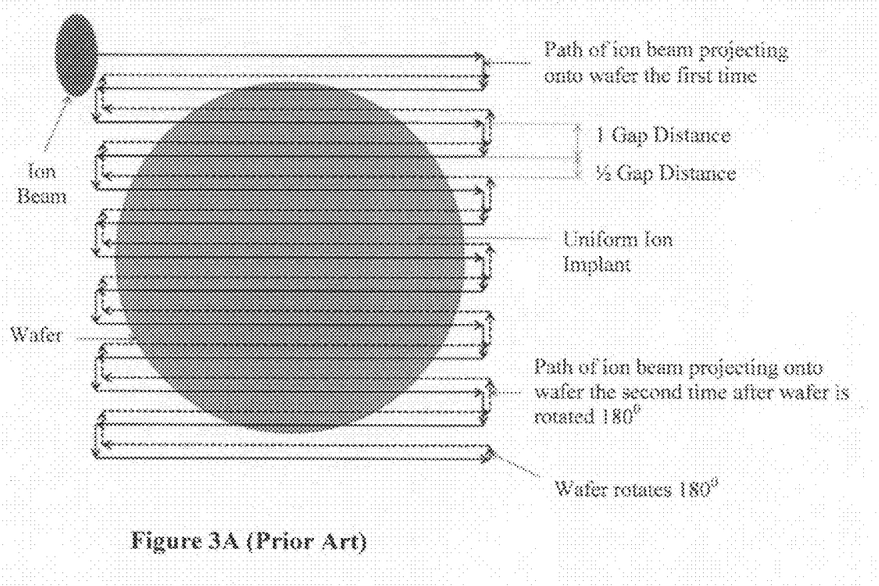
FIG. 3A shows a two-dimensional mechanical scan with a scanning beam with a height smaller than wafer diameter wherein a wafer is held on a robot type of object to move left/right and up/down to form beam implanted pattern.

FIG. 3 depicts another implant system that generates a spot beam smaller than the target. The beam height is smaller than wafer diameter, 2D mechanical scans (a wafer is held on a robot type of object that can move left/right and up/down to form beam implanted pattern as shown FIG. 3A. In order to have sufficiently good implanted dose uniformity, the implant process requires multiple scan operations. The implant process thus requires longer scanning time. Also, there are many turns around on left and right ends and these turns around that have decelerations and accelerations must happen when beams are not in wafers so that beams are wasted. The implant system utilizes a spot beam small than the target thus has poor beam utilization.

As discussed above, due to the complex interactions between the ion beam and the magnetic field applied for beam expansion, this approach creates severe technical, practical, and process related problems that increase the total production cost of such equipment and lead to more complicated operation procedures for carrying out the ion implantation. In particular, the beam path through this system is relatively long, and at low energies and high beam currents it becomes increasingly difficult to control the uniformity of the ion beam and the angular variation within the beam with the precision required by certain commercial processes.

It is further desirable to generate implanting ions with an ion current of milli-amperes and at an energy level as low as 200 ev. The highest beam currents are obtained by decelerating the ion beam immediately prior to the target. However this practice has several known disadvantages. One disadvantage is that the deceleration tends to modify the trajectories, magnifying any angular errors and making it very difficult to control both the angle and dose uniformities in a scanned ion beam.

Since the conventional types of ion implantation systems cannot provide a viable solution for performing one wafer at a time implantation with a high-current, high dose and angle uniformities there is a need in the art of integrated circuit fabrication to provide a new system to resolve the above-discussed difficulties. A new system configuration is required to generate a high current implantation with improved dose uniformity without sacrificing the implantation angle uniformity while reducing the production cost and simplifying the manufacturing processes.

SUMMARY OF THE PRESENT INVENTION

One aspect of the present invention is to provide an improved ion implantation apparatus comprising an ion source, an extraction assembly for extracting an ion beam through a convergent extraction-optics, a magnetic beam scanner and magnetic analyzer for selecting ions with specific mass-to-charge ratio to pass through a mass slit, and a rectangular quadruple magnet for collimations of the scanned ion beam, The collimated beam is projected onto a substrate. The implantation apparatus further includes a target chamber in which is mounted a target for implantation. The target is a semiconductor wafer or flat panel display. The extraction-optics has a concave geometry to produce a beam that is converging as it leaves the extraction-optics. The ion beam is scanned by a dipole magnet in the non-dispersive plane of the mass analyzer magnet. As the beam continues to travel through the mass analyzer magnet the beam scanning displacement continues to become larger such that when the ion beam reaches the target wafer, it has the sufficient displacement to cover the entire diameter of the wafer. The apparatus for ion implantation further includes a diagnostic means for beam current measurement device disposed in proximity to the target wafer for scanning across the scanning direction of the ion beam to measure the beam currents and angles at different locations and to provide the measurement data back to the beam scanning and angle controllers.

Another aspect of the present invention is to provide an improved ion implantation system that implements a rectangular quadruple magnet to collimate the scanned ion beam and beam angle fine tunes based on the data measured by the beam diagnostic means. Moreover, this magnet can modify overall beam shape that is necessary to optimize the implantation processes.

In certain circumstances such as when using high-current low energy beams it may not be possible to assure a scanned beam that is sufficiently to obtain implant dose and angle uniformities. Another embodiment of this invention comprises an ion source, which generates a converging ion beam, a magnetic mass-analyzer, a rectangular quadruple magnet for shaping the beam, and a processing station where a work-piece such as a silicon wafer or flat-panel can be mechanically moved through the ion beam. In a first mode, the extracted convergent beam is scanned in the non-dispersive plane. The scanning displacement increases as the ion beam propagates as it exceeds a dimension of the wafer diameter. The wafer is then translated through this ion beam along a single path, one or more times, to implant a desired uniform dose of ions into its surface. In a second mode, the scan magnet is not energized so that the beam continues to converge in the non-dispersive plane, thereby generating at a downstream location a beam spot which is smaller in both transverse dimensions than either dimension of the wafer. The wafer is then translated in a reciprocating path in two dimensions through the ion beam, so as to implant a uniform dose of ions into its surface by implanting a succession of partially overlapping stripes.

The second mode is likely to be advantageous when using high-current, low-energy beams (for example greater than 1 mA at energies below 3 keV) under which conditions space-charge and other effects make positive control of the uniformity of the current in a beam more difficult. The first mode requires slower motions and is likely to deliver higher processing throughput at energies where satisfactory control of the ion beam profile can be achieved. The currents in the rectangular magnet in either mode may be adjusted to fine-tune the beam angles and intensity profiles. In the second mode, this may be valuable to approximate a smooth beam intensity profile along the slower mechanical scan direction. Without a smooth beam profile, the method of passing the wafer in regular increments through the ion beam may cause detectable stripes of varying ion beam dose in the wafer.

DESCRIPTION OF THE PREFERRED EMBODIMENTS

Figure 4:
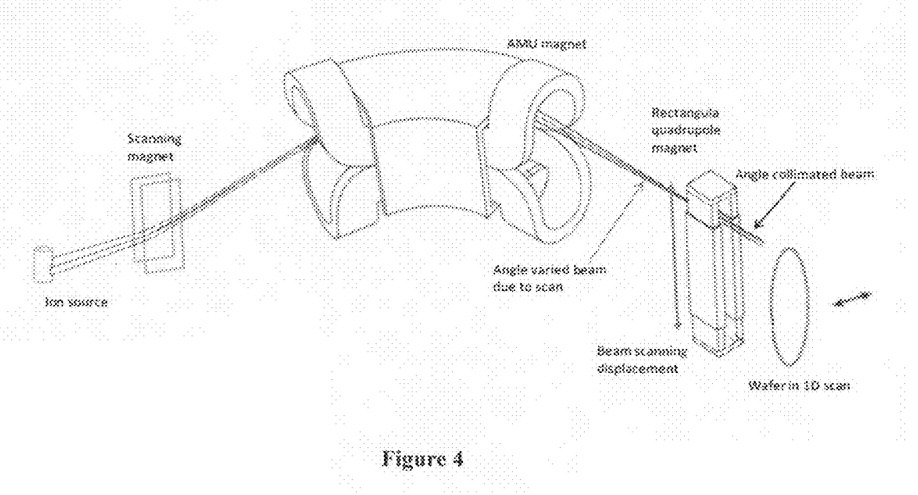
FIG. 4 is a perspective view of a scanned-beam system of this invention in which the ion beam is scanned and displaces through an analyzer magnet and is then collimated by a rectangular magnet.

FIG. 4 is a perspective view of a first embodiment of an ion implantation system of the present invention. The system comprises an ion source that produces an ion beam that emanates from a divergent extraction optics, a scan magnet, a mass analyzer magnet, and a rectangular quadrupole magnet. As will be appreciated by those skilled in the art, these elements are housed in a vacuum enclosure (not shown). The mass analyzer magnet is large pole-gap window-frame dipole. The details of the analyzer magnet are described in U.S. Pat. Nos. 5,736,743 and 6,403,967 and the disclosures made in these patents are hereby incorporated by reference in this Patent Application. The scan magnet scans the beam by controlling the scan magnet coil current. The beam is scanned slower where a measurement of beam current is smaller and faster where the beam current is higher. By applying such control, a uniform beam is generated without requiring beam-let angle changes.

Figure 5:
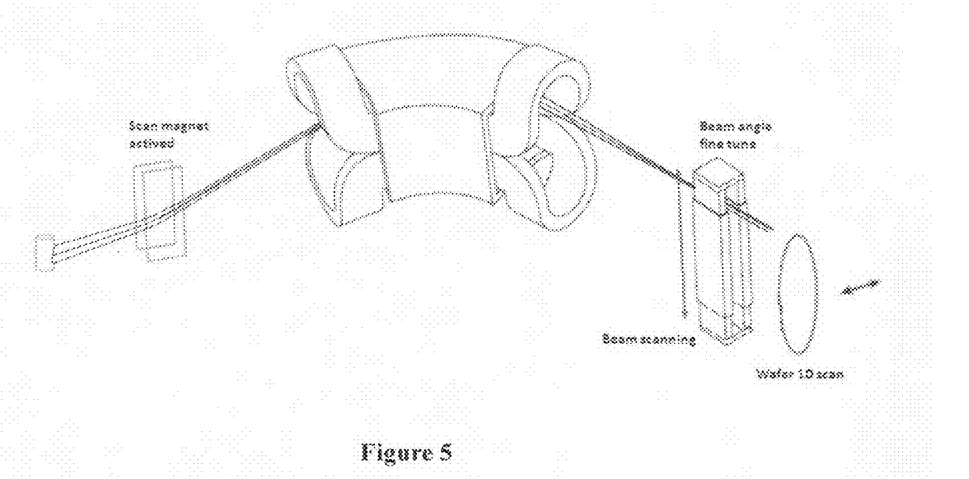
FIG. 5 is a perspective view of a scan beam system of this invention that has the displacement greater than the wafer diameter.

FIG. 5 is a perspective view of a beam scan system wherein the beam is controlled to have a displacement greater than the wafer diameter, Specifically, this system can tune the beam current uniformity and beam angle separately. The beam adjustment to achieve uniform dose will not change implant angles. Therefore, both the implant dose and angle uniformity can be maintained. The scan magnet coil currents can be adjusted to change beam scan speed based on beam currents measured in positions relative to wafer positions. The good implanted dose uniformity can be achieved, the rectangular quadrupole magnet is used for the beam angle tuning. As the beam is scanned in the divergent direction, the scanned beam range will be greater than wafer's diameter. It only needs one dimensional mechanical wafer scan to have the wafer crossed the beam. In the one-dimensional mechanical scan case the minimum scan number required for a uniform implant is much smaller than two-dimensional mechanical scan. Therefore, the implant time is less and a higher throughput is achieved.

Figure 6:
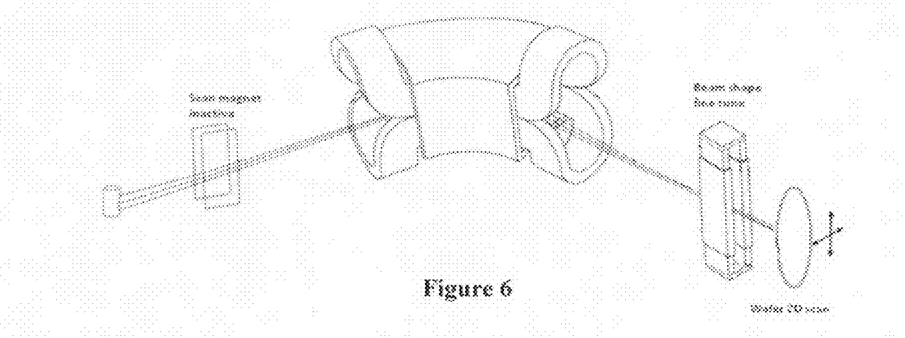
FIG. 6 is a perspective view of a scan beam system of this invention that generates a spot beam smaller than the wafer diameter.

FIG. 6 is a perspective view of another beam scanning system of this invention to provide a spot beam smaller than the wafer diameter to apply the ion beam for carrying out a very low energy implant. An ion beam with a very low generally has a difficulty that the shapes of the cross section of the beam often vary significantly along beam scan direction. For that reason, a high quality with uniform implant dose is difficult to achieve with a one-dimensional mechanical scan system. Therefore, a stationary spot beam is implemented with a two-dimensional mechanical scan mode to carry out a low energy implants. Therefore, the beam scanning system as disclosed in this invention can carry out a beam scan operation with either one-dimensional or two-dimensional mechanical scan mode. The scanned beam is operated with 1D mechanical scan for higher energy beam implants and stationary spot beam with 2D mechanical scan for low energy beam implants.

Figure 7:
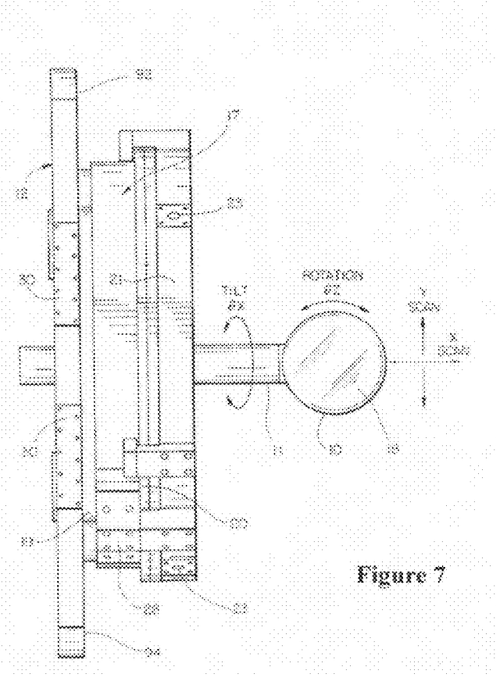
FIG. 7 shows a side cross sectional view of an apparatus for scanning the target through the ion beam in either one or two dimensions.
Figures 7A, 7B:
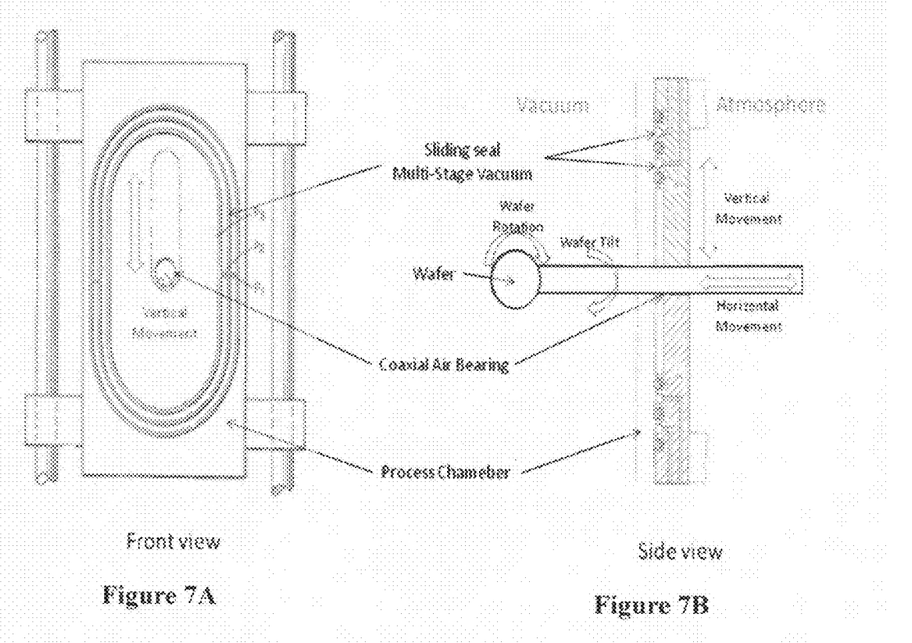
FIGS. 7A and 7B are a front view and a side view to show the operation of the apparatus.
Figure 7C:
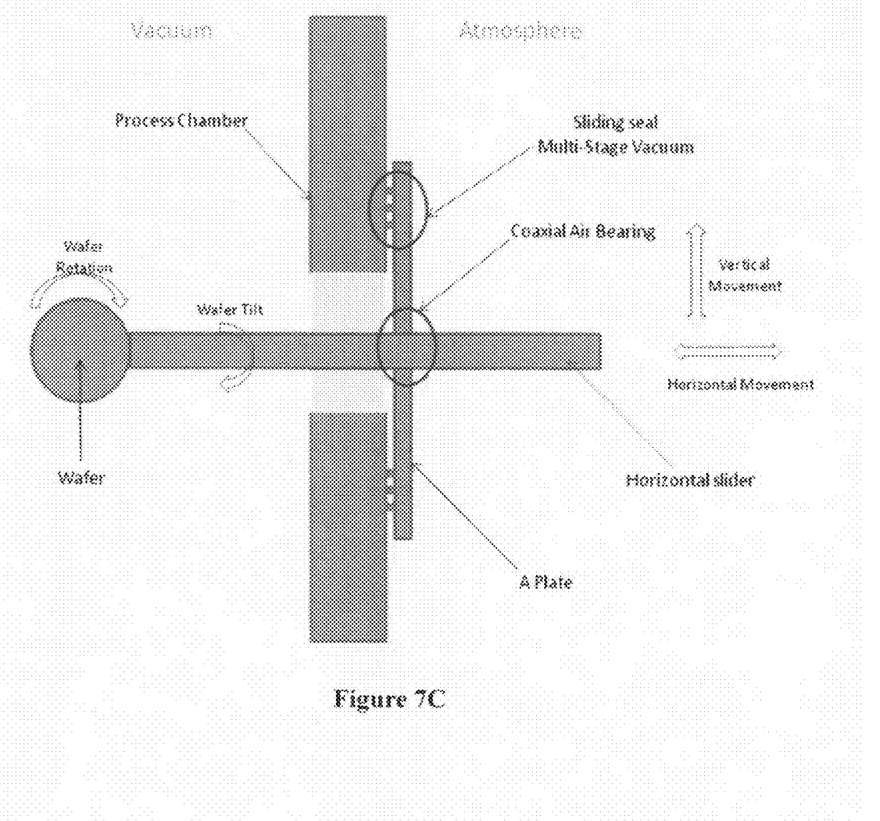
FIG. 7C shows details of the configuration and the movements of the mechanical parts of the system.

FIG. 7 shows a side cross sectional view of an apparatus for scanning the target through the ion beam in either one-dimensional or two dimensional modes. Comparing to other implanter's mechanical scan systems, this apparatus is very simple and cost effective. It only need a sliding seal (Y-scan) and an air bearing (X-scan and tilt) to meet the needs of one-dimensional mechanical scan and two-dimensional mechanical scan vacuum seals. Sliding seal is very mature technology and there are more than 3000 implanter systems use this type of vacuum seals. The coaxial air bearings are commercial items. FIGS. 7A and 7B are a front view and a side view to show the operation of the apparatus. The details of the configuration and the movements of the mechanical parts of the system are shown in FIG. 7C.

Figure 8:
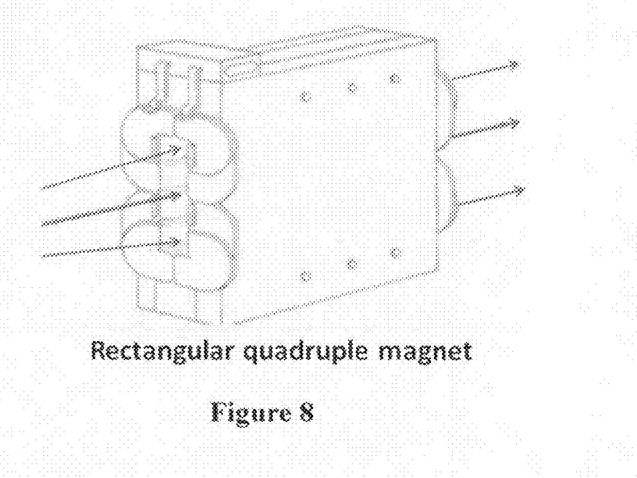
FIG. 8 illustrates the detailed construction of a rectangular quadrupole magnet.
Figure 8A:
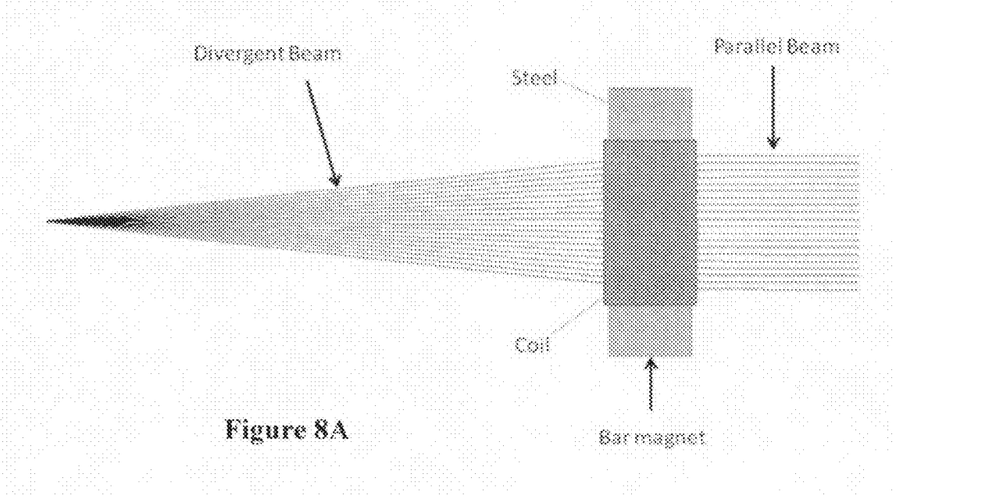
FIG. 8A shows the functional features of a bar magnet applied to collimate ion beam with divergent beam angles.
Figure 8B:
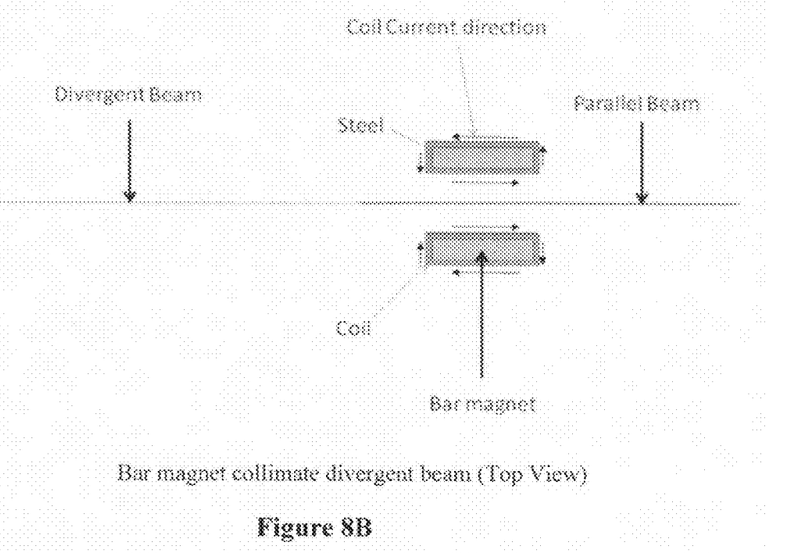
FIG. 8B shows another configuration of bar magnets applied to collimate ion beams.
Figure 8C:
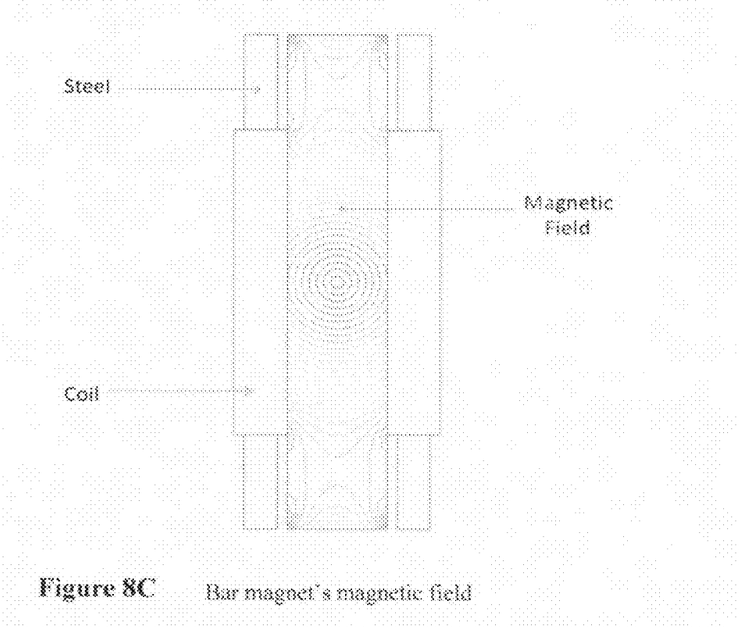
FIG. 8C shows the magnetic field.

FIG. 8 is a perspective view to illustrate the detailed construction of a rectangular quadrupole magnet. One embodiment of the magnet comprises a Panofsky magnet implemented with bar magnets with different shapes. FIG. 8A shows the functional features of a bar magnet applied to collimate ion beam with divergent beam angles. FIG. 8B shows another configuration of bar magnets applied to collimate ion beams. The magnetic field is shown in FIG. 8C. According to the shape of the bar magnetic field and Lorentz Force Law, the field can bend the beam from divergent to parallel when the bar magnet coil current setting is fine tuned.

Although the present invention has been described in terms of several embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. An ion implant apparatus comprising:
a magnetic scanner prior to a magnetic analyzer for scanning an ion beam on a non-dispersive plane with the magnetic analyzer for selecting ions with specific mass-to-charge ratio to pass through a mass slit to project onto a substrate.

2. The ion implant apparatus of claim 1 further comprising:
a rectangular quadruple magnet to collimate the ion beam and to adjust and correct ion beam incident angles onto a target.

3. The ion implant apparatus of claim 2 further comprising:
a deceleration or acceleration system disposed at a downstream location of a beam collimator for carrying out an energy filtering function.

4. The ion implant apparatus of claim 3 further comprising:
a two-dimensional mechanical scanning system with a built-in diagnostic system for adjusting a relative position between the ion beam and a target for scanning the target.

* * * * *